United States Patent [19]
Harshbarger

[11] B 3,991,388
[45] Nov. 9, 1976

[54] START-STOP TRANSISTOR COLPITTS OSCILLATOR CIRCUIT

[75] Inventor: John H. Harshbarger, Xenia, Ohio

[73] Assignee: Visual Information Institute, Inc., Xenia, Ohio

[22] Filed: Apr. 24, 1975

[21] Appl. No.: 571,219

[44] Published under the second Trial Voluntary Protest Program on February 24, 1976 as document No. B 571,219.

[52] U.S. Cl. .............................. 331/117 R; 331/173
[51] Int. Cl.² ........................................... H03B 5/12
[58] Field of Search ................ 331/117 R, 172, 173, 331/169, 170

[56] References Cited
UNITED STATES PATENTS
2,905,907  9/1959  Sanders ............................... 331/173
3,229,227  1/1966  Popodi ............................ 331/117 R

*Primary Examiner*—Siegfried H. Grimm
*Attorney, Agent, or Firm*—Melvin A. Crosby

[57] ABSTRACT

A start-stop oscillator circuit in which the oscillator circuit includes an inductor connected in parallel with a pair of serially connected capacitors. The inductor and capacitors form the tank circuit for the oscillator which is in the form of a Colpitts oscillator. In order to start and stop the oscillator within a brief period, not to exceed the conventional blanking interval for a television, switches are connected between one end of the inductor and ground and from a point between the capacitors to ground. The end of the inductor opposite the end to which the switch is connected and the corresponding end of the capacitor branch are also connected to ground. The switches, when closed, dump the tank circuit extremely quickly and when opened permit the oscillator to start up relatively quickly, whereby the complete interval of stopping the oscillator and again starting the oscillator can take place within the required brief period of time corresponding to a conventional horizontal blanking pulse in a television system.

5 Claims, 3 Drawing Figures

START-STOP TRANSISTOR COLPITTS OSCILLATOR CIRCUIT

The present invention is concerned with the synthesizing of test signals for use in television systems and is particularly concerned with the provision of a television signal having an active video portion composed of sine wave information phase locked to the television horizontal blanking signal.

The synthesized test signal may be used as a burst signal of varied frequency content for equipment band width analysis, for example.

Problems have existed in the prior art in respect of synchronizing oscillators in such test equipment at the beginning of a scan line, after the oscillator has been halted at the end of the previous line. In general, oscillators of the Colpitts configuration are employed because such oscillators do not require a tapped coil as employed with Hartley oscillators and can, accordingly, be readily constructed relatively inexpensively from commonly available components.

The oscillators of the nature referred to are readily operable over the desired frequency range of about 0.5 mHz to 30 mHz and higher, and can easily be locked in phase to a television synchronizing signal.

It has been found that oscillators of the nature referred to will begin operation in a predictable phase if the tank circuit operation is interrupted and is thereafter released in a predictable manner. In such case, the sine wave signal can be developed in synchronism repeatedly and which type of operation is necessary in respect of television test systems.

Circuit arrangements according to prior art, however, have been only marginally successful in respect of achieving the desired operation of the oscillator circuit. Once a tank circuit is in oscillation, it is very difficult to force a rapid interruption of oscillation because of the energy stored in such a circuit. This is an inherent characteristic of a Colpitts type oscillator, for example. The time available for synchronizing is quite brief, amounting to only about 7 up to about a maximum of 11 microseconds.

The stopping and starting of the oscillator circuit must take place within this interval and it is in connection with this specific requirement that problems have been encountered heretofore.

The particular problem appears to arise in connection with completely collapsing tank operation of the oscillator and which has been found to exceed 20 cycles, on occasion. Under these circumstances, unpredictable synchronism is had, leading to undesirable results.

With the foregoing in mind, a primary objective of the present invention is the provision of a start-stop oscillator circuit, especially for use in television test equipment, in which starting and stopping of the oscillator can readily be accomplished within the brief interval of a television horizontal blanking pulse.

A further object is the provision of a start-stop oscillator circuit arrangement which can be stopped and again restarted within the interval of a television horizontal blanking pulse and which can be constructed utilizing substantially conventional readily obtainable circuit elements.

The exact nature of the present invention will become more apparent upon reference to the following detailed specification taken in connection with the accompanying drawings in which.

BRIEF SUMMARY OF THE INVENTION

According to the present invention, a Colpitts oscillator circuit is provided in which an inductor is connected in parallel with serially arranged capacitors. The parallel connected inductor and capacitors from the tank circuit of the oscillator. One end of the tank circuit is grounded, while the other end is connected via a transistor to a source of voltage. The voltage side of the transistor, and which is the emitter of the transistor, is connected to a point between the serially connected capacitors. Another voltage source is connected to ground via a voltage divider and point on the voltage divider is connected to the base of the transistor to hold the transistor in conduction.

The first mentioned source of voltage is connected via a resistor with the emitter of the transistor and a tap is taken from the resistor to form the output terminal for the oscillator circuit.

The described arrangement, with proper values selected for the inductor and capacitors, will oscillate in a known manner.

A first control point is provided on the tank circuit at the transistor end thereof and a second control point is provided which is connected to the juncture of the serially connected capacitors. A switch is provided between each control point and ground and the switches, when closed, will dump, or collapse, the tank circuit quickly and, when open, will permit the tank circuit to charge, and the oscillator to return to an oscillating condition quickly.

The switches can be any of several known types, such as saturating transistors, field effect transistors, integrated circuit analog switches, or even a conventional relay if operable at a high enough speed. The switches, in any case, are operated by a control signal which provides for rapid closing and opening of the switches.

DETAILED DESCRIPTION OF THE INVENTION

Figure 1:
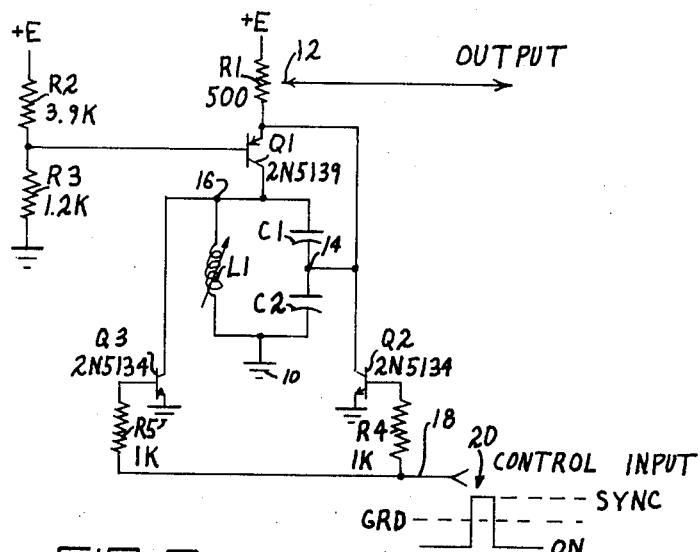
FIG. 1 shows the start-stop oscillator circuit according to the present invention.

Referring to the drawings somewhat more in detail, FIG. 1 shows an oscillator circuit having control means associated therewith according to the present invention. In FIG. 1, L1 represents an inductor which may, for example, be on the order from 7.8–12 mh. The inductor is connected in parallel with a pair of capacitors C1 and C2 which may have values, for example, of 1000 pf and 360 pf, respectively.

The tank circuit values given provide for an oscillation frequency of about 3.0 mHz. Other values are, of course, utilized for other oscillation frequencies and inductor L1 could, for example, be variable, as indicated, to provide for adjustment of the oscillation frequency of the circuit.

One end of the tank circuit described is grounded as at 10, and the other end is connected to the collector of a transistor Q1, the emitter of which is connected through a resistor R1 to a source of positive voltage marked +E.

The base of transistor Q1 is connected to the junction of a pair of resistors R2 and R3 with the other end of resistor R3 being grounded and the other end of resistor R2 being connected to a source of positive voltage, also marked +E on the drawing.

A tap 12 is provided on resistor R1 and this forms the output for the oscillator circuit.

A point 14 between capacitors C1 and C2 is connected back to the emitter of transistor Q1 for the necessary feedback to maintain the circuit in a condition of oscillation.

Point 14 forms a first control point for the circuit and point 16 at the transistor end of the tank circuit forms a second control point. Each control point is connected to the collector of a respective transistor Q2, Q3, the emitter of which is grounded. The base of each transistor is connected through a respective resistor R4, R5, to a control line 18 adapted for receiving the control signal indicated by reference numeral 20 and which is advantageously in the form of a rectangular pulse.

When the rectangular pulse 20 goes high, transistors Q2 and Q3 go to conduction and substantially instantaneously dump, or collapse, the tank circuit. When the control pulse 20 goes low, the transistors Q2 and Q3 go to non-conduction and the circuit will again charge up and commence oscillating.

Figure 2:
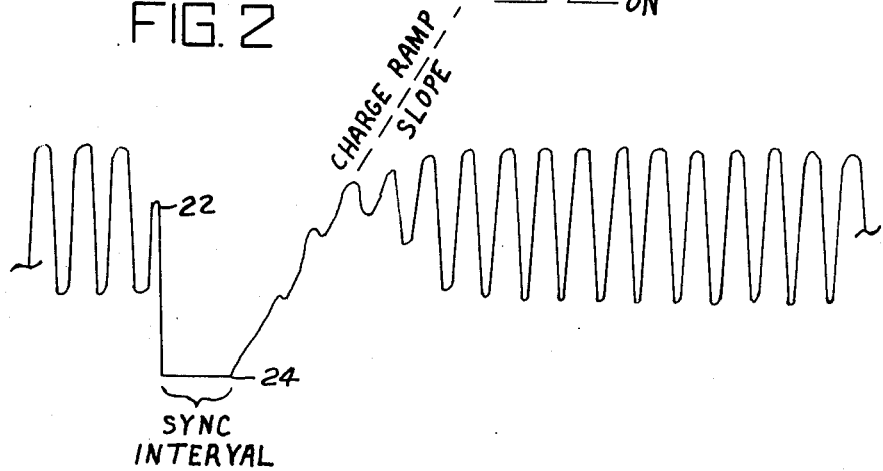
FIG. 2 shows the wave form produced by the oscillator and shows the operation of the oscillator from the end of one scan line to the beginning of the next scan line.

FIG. 2 shows the speed with which the oscillator according to the present invention can be stopped and the speed with which the oscillator starts. As will be seen, at the time the signal at the end of a scanning line occurs, and which is indicated at 22 in FIG. 2, the oscillator stops oscillating and this will take place quite rapidly. At the end of the synchronizing interval, and which is indicated at 24 in FIG. 2, the circuit commences to charge up and will be in full oscillation in about 6 or 7 cycles.

The entire interval from the collapsing of the tank circuit until the oscillator is again in full, stable, oscillation takes place well within the interval of a horizontal blanking pulse and the circuit is thus ideally adapted for use with television test instruments.

Figure 3:
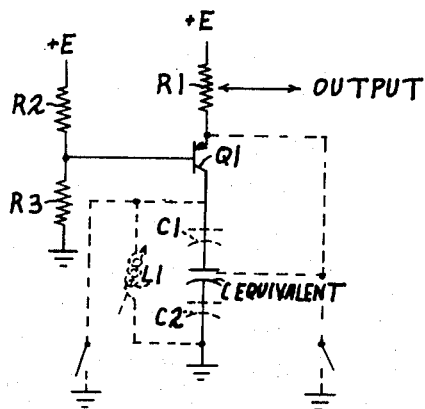
FIG. 3 shows an equivalent charging circuit for the oscillator at start up of the oscillator.

The equivalent charging circuit for the oscillator circuit at start up is shown in FIG. 3, and the same reference numerals as have been employed in FIG. 1 are applied in FIG. 3, except the transistor switches are shown merely as bladed switches and both in open condition for a graphic representation of the circuit condition.

It will be noted that capacitor C1 and C2 are replaced in FIG. 3 by a single capacitor marked C equivalent. It will be evident that the improved circuit according to the present invention results in a slightly longer start up interval and which would be, in some circumstances, an undesirable feature, but this can readily be accommodated because synchronism is achieved extremely rapidly as has already been described.

The somewhat longer time for start up comes about because the voltage at the emitter of transistor Q1 goes to zero when the oscillator stops and at least a short interval of time is necessary before this voltage is restored and charging current can flow to the capacitors of the tank circuit.

In practice, after the stopping switches have been opened the wave form at the emitter of transistor Q1 appears as a ramp function which ascends until normal operating voltage is achieved, and at which time, a normal oscillation mode of the oscillator resumes as illustrated in FIG. 2 with the oscillator in stable operation and with the steady state envelope.

Modifications may be made within the scope of the appended claims.

What is claimed is:

1. A start-stop transistor colpitts oscillator circuit comprising a tank circuit in the form of an inductor and a pair of serially connected capacitors in parallel with the inductor, one end of said tank circuit forming a first control point and the junction between said capacitors forming a second control point, a first voltage terminal connected to the other end of the tank circuit, a second voltage terminal, a transistor having collector, emitter, and base terminals and having the collector-emitter path connected between said second voltage terminal and said one end of the tank circuit, a source of biasing voltage connected to the base terminal of said transistor and biasing the transistor to conduction, a feedback connection from the juncture of said capacitors to the emitter terminal of said transistor, first and second switch means each having conductive and nonconductive conditions and connected between said one voltage terminal and said first and second control points respectively, and means for changing both of said switch means between conductive and nonconductive conditions in unison.

2. An oscillator circuit according to claim 1 which includes a resistor between said second voltage terminal and said transistor.

3. An oscillator circuit according to claim 1 which includes a resistor between said second voltage terminal and said transistor, said first voltage terminal being at ground potential and said second voltage terminal being at a positive voltage, said transistor having the collector terminal on the side nearest the tank circuit and the emitter terminal on the side nearest said second voltage terminal.

4. An oscillator circuit according to claim 1 in which each said switch means is a solid state component having a current path connected between the respective control point and said first voltage terminal, each component having a control terminal sensitive to a predetermined voltage to cause the respective current path to go to conduction.

5. An oscillator circuit according to claim 1 in which each said switch means is a saturating transistor having base, collector and emitter terminals and the collector-emitter path connected between said first voltage terminal and a respective one of said control points, the bases of said transistors being interconnected, and a source of control pulses connected to said interconnected bases.

* * * * *